United States Patent

Wolf et al.

[11] Patent Number: 5,935,405
[45] Date of Patent: Aug. 10, 1999

[54] PROCESS FOR PRODUCING RIGID AND FLEXIBLE CIRCUITS

[75] Inventors: Gerhard-Dieter Wolf, Dormagen; Friedrich Jonas, Aachen, both of Germany

[73] Assignee: Bayer Aktiengesellschaft, Leverkusen, Germany

[21] Appl. No.: 08/926,111

[22] Filed: Sep. 9, 1997

[30] Foreign Application Priority Data

Sep. 12, 1996 [DE] Germany ............... 196 37 018

[51] Int. Cl.⁶ .................. C25D 5/02; H05K 3/18
[52] U.S. Cl. ........................ 205/125; 205/122
[58] Field of Search .................. 205/122, 125, 205/118

[56] References Cited

U.S. PATENT DOCUMENTS

| | | | |
|---|---|---|---|
| 3,847,659 | 11/1974 | Sobajima et al. | 117/211 |
| 3,874,903 | 4/1975 | Wirth et al. | 117/72 |
| 5,035,926 | 7/1991 | Jonas et al. | 427/393.1 |
| 5,183,552 | 2/1993 | Bressel et al. | 205/158 |
| 5,194,313 | 3/1993 | Hupe et al. | 428/137 |
| 5,262,041 | 11/1993 | Gulla | 205/125 |
| 5,300,208 | 4/1994 | Angelopoulos et al. | 205/50 |
| 5,300,575 | 4/1994 | Jonas et al. | 525/186 |
| 5,403,467 | 4/1995 | Jonas et al. | 205/125 |

FOREIGN PATENT DOCUMENTS

| | | |
|---|---|---|
| 0339340 | 11/1989 | European Pat. Off. . |
| 0413109 | 2/1991 | European Pat. Off. . |
| 0417750 | 3/1991 | European Pat. Off. . |
| 0440957 | 8/1991 | European Pat. Off. . |
| 0616267 | 9/1994 | European Pat. Off. . |
| 0668662 | 8/1995 | European Pat. Off. . |
| 0686662 | 12/1995 | European Pat. Off. . |
| 3806884 | 9/1989 | Germany . |

*Primary Examiner*—Kathryn Gorgos
*Assistant Examiner*—William T. Leader
*Attorney, Agent, or Firm*—Sprung Kramer Shaefer & Briscoe

[57] ABSTRACT

Rigid or flexible circuits of electrically conductor tracks can be produced on flexible or rigid, non-conductive support materials by a) coating the surfaces of the support materials including existing drill holes with a primer and a conductive polymer, preferably poly-3,4-ethylendioxythiophene, which may contain binders, b) applying an electroplating resist in the form of the negative image of the conductor tracks, c) metallizing by electroplating the surface kept free by the electroplating resist, including existing drill holes, in the form of the positive image of the conductor tracks, d) removing the electroplating resist and e) removing the conductive polymer, which had been below the electroplating resist, or converting it to a non-conductive form, wherein the conductor tracks are electrically interconnected during the metallizing step by the layer of conductive polymer, thereby avoiding the need to individually contact each conductor track.

8 Claims, No Drawings

PROCESS FOR PRODUCING RIGID AND FLEXIBLE CIRCUITS

BACKGROUND OF THE INVENTION

The invention relates to a process for producing rigid or flexible, electrically conductive conductor tracks/circuits or also 3D-molded interconnection devices with concomitant use of a conductive polymer.

The production of rigid and flexible electronic conductor track/circuits by various subtractive, additive and semiadditive processes on rigid and flexible substrates is generally known and has, in various designs, been a part of the state of the art for many years (Günther Herrmann, Handbuch der Leiterplattentechnik [Handbook of printed circuit technology], published by Eugen G. Leuze Verlag, 1982, D-88348 Saulgau).

For some time, conductive polymers have been increasingly playing a role in the production of printed circuits. Thus, the use of conductive polymers, in particular of polypyrrole, for the direct drill hole metallization of printed circuits and also of flexible circuits by electroplating is described in German Offenlegungsschrift 3,806,884. In U.S. Pat. No. 5,403,467, the use of polythiophenes for the same purpose, namely for direct through-contacting of printed circuits by electroplating, is specifically claimed.

The use of conductive polymers has also been proposed for the production of conductor tracks. In European Patent No. 615,256, a process using poly-3,4-ethylenedioxythiophene for producing conductor tracks is described. In this process, the conductive polymer is applied or structured in the form of the desired image of conductor tracks. This process has the disadvantage that, after the structuring of the conductive layer, there are only individual, not interconnected conductive tracks present on the substrate, which tracks accordingly have to be contacted individually for the electroplating metallization.

SUMMARY OF THE INVENTION

The invention now relates to a process for producing rigid and flexible electronic circuits and 3D-molded interconnection devices, which avoids this disadvantage of the contacting of individual conductor tracks.

Surprisingly, the build-up of conductor track structures with high uniformity and satisfactory metallization rate and contacting at only one point in the circuit is then very easily possible if the production of the circuits from electrically conductive tracks is carried out by the process according to the invention.

The process according to the invention for producing rigid or flexible circuits from conductor tracks, electrically interconnected during the production step, on non-conductive support materials comprises the following process stages:
  a) Coating the surfaces of the rigid or flexible support materials including existing drill holes with a conductive polymer which may contain binders,
  b) applying an electroplating resist in the form of the inverse (negative) image of the conductor tracks,
  c) metallizing by electroplating the surface kept free by the electroplating resist, including existing drill holes, in the form of a positive image of the conduct or tracks,
  d) removing the electroplating resist and
  e) removing the conductive polymer from the non-metallized areas or converting the conductive polymer to a non-conductive form.

Compared with the state of the art with isolated conductor tracks which have to be contacted individually, the process according to the invention also has the advantage that, owing to the contacting of the entire conductive area on the exposed conductor tracks, higher current densities and hence faster metallization can be achieved.

By means of the process according to the invention, mechanically stable conductor tracks can be generated both on rigid and on flexible support materials.

DETAILED DESCRIPTION OF THE INVENTION

Suitable support materials for producing flexible circuits are polymer films of, for example, polycarbonate, ABS, polyvinyl chloride, polyester such as polyethylene terephthalate, polyethylene naphthalate and polybutylene terephthalate, polyimide, for example Kapton films made by DUPONT, and blends thereof.

Suitable support materials for producing rigid circuits are, for example, organic thermosetting support materials based on phenolic resin/paper, glass fiber-filled epoxide resins, for example FR 3 and FR 4 materials (Handbuch der Leiterplattentechnik [Handbook of printed circuit technology], loc. cit), epoxide/isocyanurate resins, polyimide resins and/or thermoplastic polymers such as polycarbonate, polyester, ABS, polystyrene, polysulfones and copolymers or blends thereof.

Examples of electrically conductive polymers suitable for the process according to the invention are: optionally substituted polyanilines, polypyrroles or polythiophenes. Optionally substituted poly-3,4-ethylenedioxythiophenes, such as are described in European Patents 339,340 and 440,957, are particularly preferred.

The preparation of the conductive polymer layer can take place by direct polymerization of the monomers, on which the conductive polymers are based, on the printed circuit substrates. Relevant processes are known and are described, for example, in European Patent 339,340. Furthermore, for producing the conductive polymer layer, solutions or dispersions of the conductive polymers can also be used for coating. Relevant polymer solutions or dispersions are described, for example, in European Patent 440,957. Mixtures for obtaining conductive coatings having a low surface resistivity of <500 ohm/square are described in European Patent No. 668,662. The conductive polymer layer can be applied by known processes, for example by spraying, printing, blade application or casting. The conductive polymer is preferably applied from aqueous solution. Moreover, water-miscible solvents, for example alcohols such as methanol and isopropanol, ketones such as acetone and methyl ethyl ketone, cycloaliphatic amides such as N-methylpyrrolidone and N-methylcaprolactam, aliphatic amides such as N,N-dimethylacetamide, or mixtures thereof can be added to the solution of the conductive polymer.

Binders can be added to the solutions of the conductive polymers. Examples of suitable binders are aliphatic, aromatic or aliphatic/aromatic polyimides, polyhydantoins, polyamide-imides, polyurethanes, polyacrylates, epoxide resins, polyvinyl acetate, polyvinyl alcohol, polyolefins, polyesters and mixtures or copolymers thereof (single-layer structure). It is also possible, however, to apply the binder as a first layer in the form of a solution or a dispersion as a primer and separately from the conductive polymer, and subsequently to apply the conductive polymer, drying steps being interposed. In this case too, the solution of the conductive polymer can contain a binder which can be the same as or different from the primer. When mixtures of the conductive polymers with the binders are used, these are preferably aqueous solutions or dispersions. When the process according to the invention is carried out with such a 2-layer structure, the primer can also be applied from organic solution. Examples of suitable solvents are alcohols such as methanol, isopropanol, glycol and glycerol, ketones such as acetone and methyl ethyl ketone, aliphatic or cycloaliphatic hydrocarbons such as hexane and cyclohexane, aromatic hydrocarbons such as toluene and xylene, cycloaliphatic amides such as N-methylpyrrolidone and N-methylcarprolactam, and aliphatic amides such N,N-dimethylacetamide. Substances known especially in printing and painting technology can also be used, such as esters, for example butyl acetate, dioctyl phthalate and butyl glycolate, glycol ethers, for example ethylene glycol monomethyl ether, diglyme and propylene glycol monomethyl ether, esters of glycol ethers, for example ethylene glycol-acetate and propylene glycol monomethyl ether-acetate, and diacetone alcohol. Of course, mixtures of these solvents and blends thereof with other solvents can also be used.

Moreover, organic or inorganic fillers, which lead to improved adhesion of the metal layer subsequently applied by electroplating, can also be added to the solutions of the conductive polymers and/or to the primer. Examples of suitable fillers are titanium dioxide, silicon dioxide, disperse silicas, clay minerals, carbon blacks, aerosils, talc, iron oxides, kieselguhr, baryte, kaolins, quartz powder, zinc sulfites, chromium yellow, bronzes, organic pigments and chalk. Relative to the total of conductive polymer and, if appropriate, binder, 0 to 100% by weight of filler, preferably 5 to 50% by weight of filler, are added.

The thickness of the combination of primer layer and conductive polymer layer (2-layer structure) or of the combination of conductive polymer layer which optionally contains a binder (single-layer structure), is between 0.05 and 100 $\mu$m, preferably between 0.5 and 20 $\mu$m.

The coating of the support substrates with the conductive polymer is followed by drying of the polymer layer and, if desired, a heat treatment. The drying and heat treatment carried out depends on the solvents and binders used. The temperature is usually between room temperature and 300° C. The duration is usually between a few seconds and several minutes for the drying step. The heat treatment can take up to several hours.

The coating of the support substrates with the conductive polymer layer is followed by the application of the electroplating resist (photoresist). The electroplating resist can be applied directly in a structured form, for example by screen-printing methods or gravure offset. It is also possible, however, to apply an electroplating resist over the entire surface and to structure it according to usual methods by exposure to light through a mask and subsequent development (photolithographic structuring) or by laser ablation (partial or stage-wise ablating without removal of the layer of conductive polymer located underneath). Relevant methods are known and are described, for example, in Handbuch der Leiterplattentechnik [Handbook of printed circuit technology], loc. cit. Dry resist films can also be used. In a preferred manner, a liquid resist is used. The thickness of the electroplating resist is usually between 5 $\mu$m and 100 $\mu$m.

The structuring of the electroplating resist is followed by the electrodeposition of the metal layer. The electrodeposition takes place in commercially available metallization baths, the conductive polymer layer being connected as the cathode. Examples of metals which can be deposited are copper, nickel, gold, silver, palladium, tin and/or alloys thereof. An example of a suitable copper bath is the Cuprostar LP 1 copper bath made by Blasberg Oberflächentechnik, Solingen. The deposition takes place at current densities in the range from 0.1 to 4 A/dm$^2$. Preferably, low current densities are used at the start, and these are slowly increased during the electrodeposition. The deposited metal layer amounts to between 0.1 and 140 $\mu$m, preferably between 1 $\mu$m and 50 $\mu$m.

After the deposition of the metal layer, the electroplating resist and, if appropriate, the conductive polymer layer at the non-metallized sites are removed in one step or the conductive polymer layer is converted to a non-conductive state. The removal is possible, for example, by dissolving with a solvent; suitable solvents are those with which the electroplating resist or the electrically conductive polymer in solution had been applied. If the electroplating resist and the conductive polymer are removed successively, the following methods are suitable for converting the conductive polymer layer to the non-conductive, insulating form:

Irradiation with short wave light, preferably short wave ultraviolet of <300 $\mu$m wavelength for conversion to a non-conductive polymer or treatment with gaseous or dissolved oxidizing agents such as ozone, potassium permanganate, hydrogen peroxide, for oxidative degradation of the conductive polymer.

EXAMPLE

A solution of 10.0 g of poly-3,4-ethylenedioxythiophene/polystyrenesulfonate in water having a solids content of 1.3% by weight, 0.15 g of 3-glycidoxypropyltrimethoxysilane, 2.0 g of a 30% by weight strength solution of sorbitol in water, 1.0 g of N-methylpyrrolidone and 6.0 g of isopropanol was spin-coated, using a spin coater at 600 rpm, onto a plate of size 10×10 cm$^2$ consisting of polyamide with a glass fiber content of 30% by weight, and dried in air. The plate was then heat treated for 30 minutes at 150° C. As electroplating resist paint, Wepelan covering paint SD 2154 E (commercial product from Lackwerke Peters, Kempen, Germany) was applied to this plate by screen-printing in the form of a negative image of the conductor tracks. The paint layer was dried for 30 minutes at 120° C. The opposite exposed edges of the conductive polymer applied over the whole area were then contacted, and copper was electrodeposited on the exposed regions in a copper bath (Cuprostar LP1 from Blasberg Oberflächentechnik).

The electroplating was carried out for 3 hours at 1.5 A/dm$^2$. After rinsing with water and drying, the electroplating resist was dissolved away with methylene chloride. This gave the desired image of the copper conductor tracks on the conductive polymer layer. The conductive polymer layer was destroyed by dipping into a solution of 70 g/l of potassium permanganate in water for 10 minutes.

EXAMPLE 2

A primer preparation containing filler and consisting of 652 parts by weight of a 40% strength aqueous dispersion of a polyurethane of linear, slightly branched aliphatic chains with —COO$^-$ and —SO$_3^-$ groups according to German Auslegeschrift 2,651,506, having a particle size from 50 to 450 nm, 115 parts by weight of TiO$_2$, and 230 parts by weight of talc was sprayed as primer in a dry layer thickness of 20 $\mu$m onto a plate of 10×10 cm$^2$ size of polyamide with a glass fiber content of 30% by weight. An aqueous solution of 10.0 g of poly-3,4-ethylenedioxythiophene/ polystyrenesulfonate solution having a solids content of 1.3% by weight, 0.15 g of glycidoxypropyltrimethoxysilane, 2.0 g of a 30% by weight strength solution of sorbitol in water, 2.0 g of N-methylpyrrolidone and 6.0 g of isopropanol was then spin coated on using a spin coater at 600 rpm, and dried in air. Subsequently, the plate was heat-treated for 30 minutes at 150° C.

Wepelan covering paint SD 2154E (commercial product from Lackwerke Peters, Kempen, Germany) was applied in the form of a negative image of the conductor tracks to this plate by screen-printing. The paint layer was dried for 30 minutes at 120° C. The opposite exposed edges of the conductive polymer, applied over the. whole area, were then contacted, and copper was electrodeposited on the exposed areas in a copper bath (Cuprostar LP 1 from Blasberg Oberflächentechnik).

The electroplating was carried out for 3 hours at 1.5 A/dm$^2$. After rinsing with water and drying, the electroplating resist was dissolved away with methylene chloride. This gave the desired image of copper conductor tracks on the conductive polymer layer. The conductive polymer layer was destroyed by dipping for 10 minutes into a solution of 70 g/l of potassium permanganate in water. The copper tracks showed an adhesion of 20 N/inch.

What is claimed is:

1. A process for producing rigid or flexible circuits from conductor tracks on a non-conductive support material, which comprises the process steps of
   a) coating the surfaces of the support material, including any existing drill holes, with a layer of electrically conductive poly-3,4-ethylenedioxythiophene which optionally contains binders,
   b) applying an electroplating resist in the form of the negative image of the conductor tracks,
   c) metallizing by electroplating the surface kept free by the electroplating resist, including any existing drill holes, in the form of the positive image of the conductor tracks,
   d) removing the electroplating resist and
   e) converting the conductive poly-3,4-ethylenedioxythiophene to a non-conductive form.
   wherein the conductor tracks are electrically interconnected during the metallizing step.

2. The process of claim 1, wherein the layer of conductive poly-3,4-ethylenedioxythiophene applied over the surfaces of the support material shows a surface resistivity of <500 ohms/square.

3. The process of claim 1, wherein before coating the surfaces of said support material with said layer of conductive poly-3,4-ethylenedioxythiophene, a primer is applied to the support material.

4. The process of claim 3, wherein the primer contains fillers.

5. The process as claimed in claim 1, wherein the electroplating resist is applied in liquid or solid form and is then photolithographically structured.

6. The process of claim 1, wherein the metallizing step is carried out in an electroplating copper bath.

7. The process of claim 1, wherein the layer of conductive poly-3,4-ethylenedioxythiophene contains fillers.

8. The process of claim 1, wherein said conductive poly-3,4-ethylenedioxythiophene is converted to non-conductive form by irradiating it with ultraviolet radiation.

* * * * *

UNITED STATES PATENT AND TRADEMARK OFFICE
CERTIFICATE OF CORRECTION

PATENT NO : 5,935,405
DATED : August 10, 1999
INVENTOR(S): Gerhardt-Dieter WOLF, et al.

It is certified that error appears in the above-identified patent and that said Letters Patent is hereby corrected as shown below:

Title Page: "Foreign Patent Documents" delete "0616267 9/1994 European Pat. Off." and substitute --0615256 9/1994 European Pat. Off.--

Signed and Sealed this

Twenty-fifth Day of January, 2000

Attest:

Attesting Officer

Acting Commissioner of Patents and Trademarks